(12) United States Patent
Kim et al.

(10) Patent No.: US 8,476,715 B2
(45) Date of Patent: Jul. 2, 2013

(54) SEMICONDUCTOR DEVICE AND METHOD OF FABRICATING THE SAME

(75) Inventors: Honggun Kim, Gyeonggi-do (KR);
YongSoon Choi, Yongin-si (KR);
Ha-Young Yi, Seongnam-si (KR);
Eunkee Hong, Sungnam-Shi (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 153 days.

(21) Appl. No.: 12/956,578

(22) Filed: Nov. 30, 2010

(65) Prior Publication Data

US 2011/0127600 A1 Jun. 2, 2011

(30) Foreign Application Priority Data

Dec. 1, 2009 (KR) .................. 10-2009-0117945

(51) Int. Cl.
*H01L 21/70* (2006.01)
*H01L 21/8234* (2006.01)

(52) U.S. Cl.
USPC .......................................... 257/390; 438/275

(58) Field of Classification Search
USPC .............. 257/316–320, 390, E27.078, E29.3–E29.309; 438/128, 275
See application file for complete search history.

(56) References Cited

U.S. PATENT DOCUMENTS

| 7,095,085 | B2 * | 8/2006 | Goda et al. ............... 257/390 |
| 7,309,891 | B2 * | 12/2007 | Yaegashi et al. ............. 257/314 |
| 7,619,927 | B2 * | 11/2009 | Cho ..................... 365/185.17 |
| 2006/0289938 | A1 | 12/2006 | Kim | |
| 2008/0003745 | A1 | 1/2008 | Myung et al. | |
| 2008/0239814 | A1 | 10/2008 | Cho | |

FOREIGN PATENT DOCUMENTS

| JP | 2008-016808 A | 1/2008 |
| KR | 10-0645066 B1 | 11/2006 |
| KR | 10 2008-0003171 A | 1/2008 |
| KR | 10-0851915 B1 | 8/2008 |

* cited by examiner

*Primary Examiner* — Calvin Lee
(74) *Attorney, Agent, or Firm* — Lee & Morse, P.C.

(57) ABSTRACT

A semiconductor device and a method of fabricating thereof, including preparing a substrate including a first and second region; forming first and second conductive lines on the first and second region, respectively, the first conductive lines being spaced apart at a first interval and the second conductive lines being spaced apart at a second interval wider than the first interval; forming a dielectric layer in spaces between the first and second conductive lines; etching the dielectric layer until a top surface thereof is lower than top surfaces of the first conductive lines and the second conductive lines; forming a spacer on the etched dielectric layer such that the spacer covers an entire top surface of the etched dielectric layer between the first conductive lines and exposes portions of the etched dielectric layer between the second conductive lines; and removing portions of the etched dielectric layer between the second conductive lines.

8 Claims, 17 Drawing Sheets

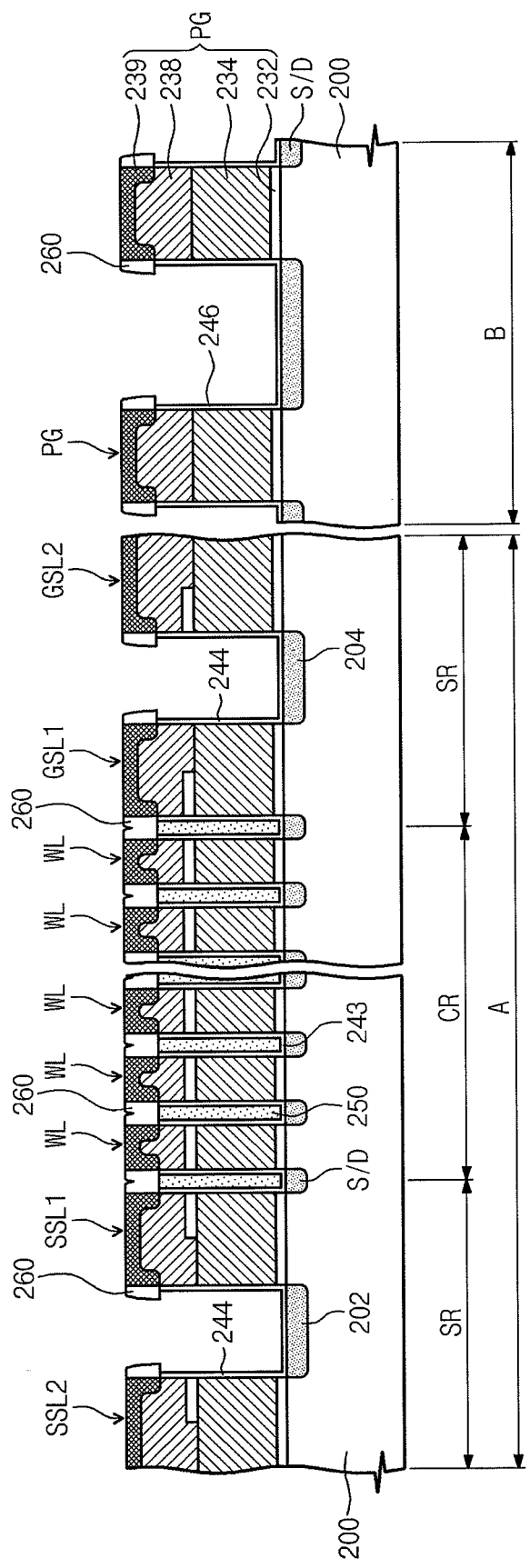

SEMICONDUCTOR DEVICE AND METHOD OF FABRICATING THE SAME

BACKGROUND

1. Field

Embodiments relate to a semiconductor device and a method of fabricating the same.

2. Description of the Related Art

As semiconductor devices are applied to various industry fields including, e.g., automobiles and ships as well as electronic equipment, the importance of the semiconductor industry has increased. In addition, as the semiconductor devices may be an important aspect in determining quality of the automobile and/or the ship, a demand for high performance semiconductor devices is increasing. In accordance with the demand, semiconductor technologies are being developed to realize high density integration, low power consumption, and/or high speed operation of the semiconductor device.

Data storage ability and characteristics of information writing and erasing are becoming more essential because these abilities and characteristics may affect reliability of various equipment embedded with a non-volatile memory device.

SUMMARY

Embodiments are directed to a semiconductor device and a method of fabricating the same.

At least one of the above and other features and advantages may be realized by providing a method of fabricating a semiconductor device, the method including preparing a substrate including a first region and a second region; forming first conductive lines and second conductive lines on the first region and the second region, respectively, the first conductive lines being spaced apart at a first interval and the second conductive lines being spaced apart at a second interval, the second interval being wider than the first interval; forming a dielectric layer in spaces between the first conductive lines and between the second conductive lines; etching the dielectric layer until a top surface of the etched dielectric layer is lower than top surfaces of the first conductive lines and the second conductive lines; forming a spacer on the etched dielectric layer such that the spacer covers an entire top surface of the etched dielectric layer between the first conductive lines and exposes portions of the etched dielectric layer between the second conductive lines; and removing portions of the etched dielectric layer between the second conductive lines.

The method may further include forming a barrier insulating layer conformally covering the first conductive lines, the second conducive lines, and portions of the substrate between the first and the second conductive lines, prior to the forming the dielectric layer, wherein the dielectric layer is formed on the barrier insulating layer.

The method may further include etching the barrier insulating layer to form a barrier insulating pattern such that the barrier insulating pattern includes a bottom portion and sidewall portions extending from sides ends of the bottom portion, wherein top surfaces of the sidewall portions are lower than top surfaces of the first conductive lines.

Forming the spacer may include forming a spacer layer on the first conductive lines, the second conductive lines, and the etched dielectric layer; and anisotropically etching the spacer layer.

Forming the first conductive lines may include forming a tunnel insulating layer on the substrate; forming a charge storage layer on the tunnel insulating layer; forming a blocking layer on the charge storage layer; and forming a control gate electrode on the blocking layer, wherein etching the dielectric layer includes etching the dielectric layer such that the top surface of the etched dielectric layer is higher than a top surface of the charge storage layer.

The method may further include metal siliciding an exposed portion of the control gate electrode prior to forming the spacer.

Forming the spacer may be performed below a critical temperature, the critical temperature being a temperature at which properties of the dielectric layer are changed.

Forming the spacer may include an atomic layer deposition process.

The method may further include forming an interlayer dielectric layer in spaces between the second conductive lines, after removing the portions of the dielectric layer, wherein the dielectric layer has a dielectric constant smaller than a dielectric constant of the interlayer dielectric layer.

The substrate may include a peripheral region separated from the first region and the second region, forming the first conductive lines and the second conductive lines may include forming peripheral gate patterns on the peripheral region, forming the dielectric layer may include forming the dielectric layer between the peripheral gate patterns, etching the dielectric layer may include etching the dielectric layer until the top surface of the etched dielectric layer is lower than a top surface of the peripheral gate patterns, forming the spacer may include forming the spacer to expose portions of the etched dielectric layer between the peripheral gate patterns, and removing portions of the etched dielectric layer may include removing portions of the etched dielectric layer between the peripheral gate patterns.

At least one of the above and other features and advantages may also be realized by providing a semiconductor device including a substrate including a first region and a second region; first conductive lines on the first region, the first conductive lines being laterally spaced apart at a first interval; second conductive lines on the second region, the second conductive lines being laterally spaced apart at a second interval, the second interval being wider than the first interval; a first dielectric layer in spaces between the first conductive lines; a second dielectric layer in spaces between the second conductive lines; and a barrier insulating pattern between the first dielectric layer and the first conductive lines, wherein the barrier insulating pattern includes a bottom portion parallel with the substrate and sidewall portions extending from side ends of the bottom portion, top surfaces of the sidewall portions are lower than top surfaces of the first conductive lines, and the first dielectric layer has a dielectric constant lower than a dielectric constant of the second dielectric layer.

A top surface of the first dielectric layer may be lower than the top surfaces of the first conductive lines.

The device may further include a spacer covering an entire top surface of the first dielectric layer and the top surface of the sidewall portion of the barrier insulating layer, wherein the spacer has an etching selectivity with respect to the first dielectric layer.

The bottom portion of the barrier insulating pattern may be between the first dielectric layer and the substrate, and the sidewall portion of the barrier insulating pattern may be between the first dielectric layer and the first conductive line.

The first conductive lines may include a tunnel insulating layer on the substrate; a charge storage layer on the tunnel insulating layer; a blocking layer on the charge storage layer;

and a control gate electrode on the blocking layer, wherein a top surface of the first dielectric layer is higher than a top surface of the charge storage layer, and the top surface of the first dielectric layer is lower than a top surface of the control gate electrode.

The control gate electrode may include a lower control gate electrode on the first blocking layer; and an upper control gate electrode on the lower control gate electrode, wherein an electric conductivity of the upper control gate electrode is higher than an electric conductivity of the lower control gate electrode.

The first region may be a memory cell region, the second region may be a selection region, the substrate may further include a peripheral region separated from the first region as well as the second region, the peripheral region may include peripheral gate patterns thereon, and the second dielectric layer may extend to the peripheral region to fill spaces between the peripheral gate patterns.

The first dielectric layer may have a dielectric constant smaller than a dielectric constant of silicon oxide.

The first dielectric layer may have a dielectric constant smaller than 3.

BRIEF DESCRIPTION OF THE DRAWINGS

The above and other features and advantages will become more apparent to those of ordinary skill in the art by describing in detail exemplary embodiments with reference to the attached drawings, in which:

FIGS. 5A through 5C illustrate cross sectional views of stages in a method of fabricating a semiconductor device according to another embodiment.

DETAILED DESCRIPTION

Figure 1:
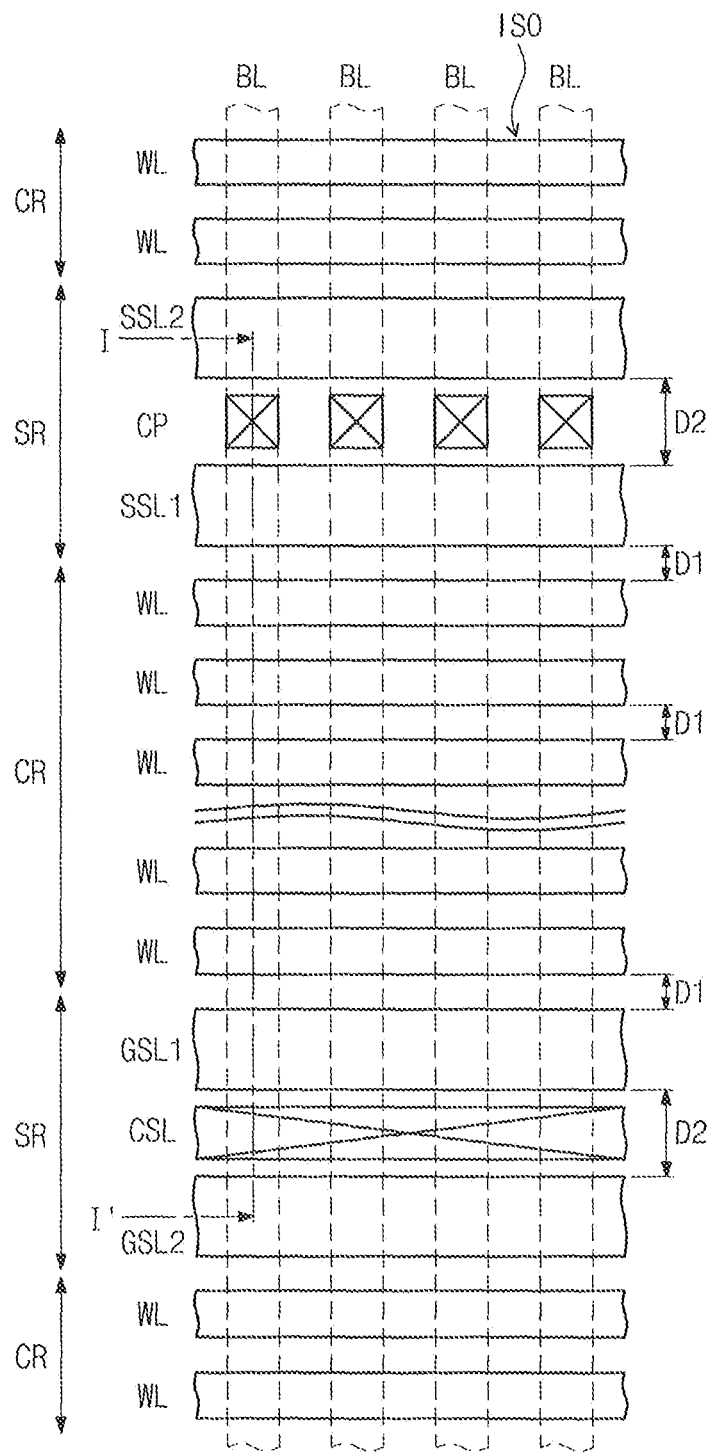
FIG. 1 illustrates a plan view of a semiconductor device according to an embodiment.

Korean Patent Application No. 10-2009-0117945, filed on Dec. 1, 2009, in the Korean Intellectual Property Office, and entitled: "Semiconductor Device and Method for Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2A:
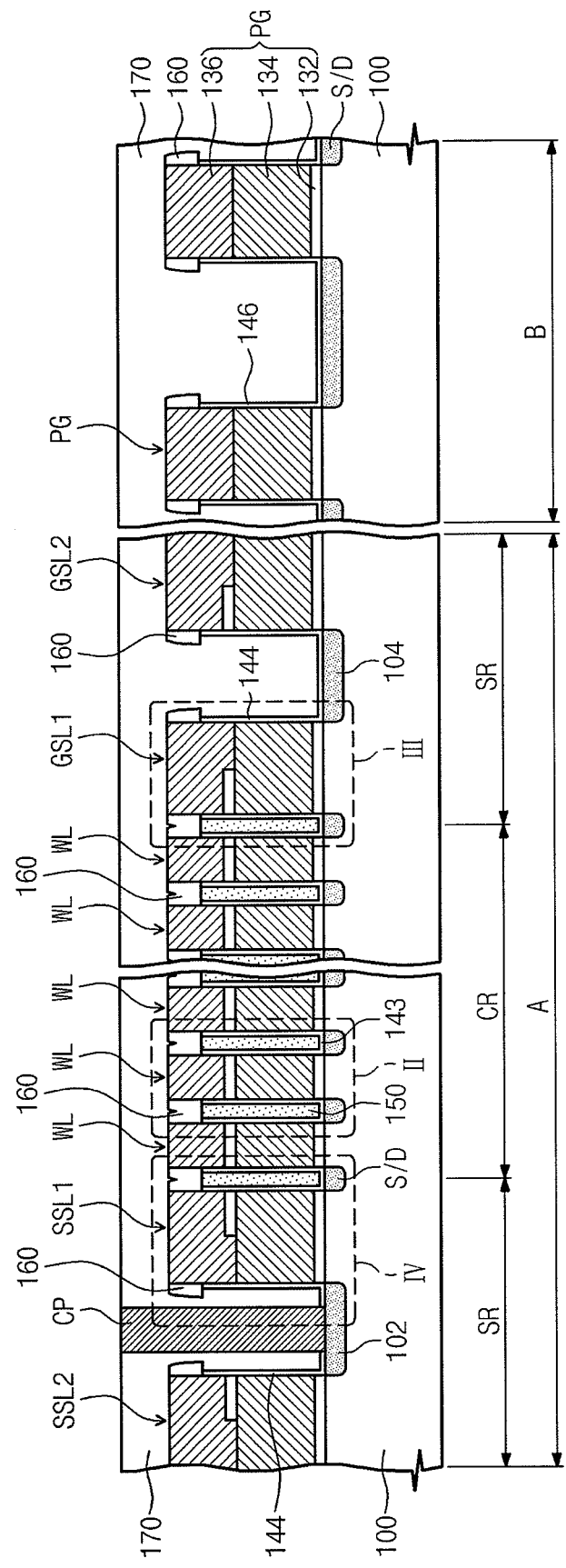
FIG. 2A illustrates a cross sectional view of the semiconductor device of FIG. 1.

FIG. 1 illustrates a plan view of a semiconductor device according to an embodiment. FIG. 2A illustrates a cross sectional view of the semiconductor device of FIG. 1. A string region A in FIG. 2A is taken along line I-I' of FIG. 1, and a peripheral region B may be a separated region from the string region A.

Referring to FIGS. 1 and 2A, a semiconductor device according to an embodiment may include the string region A and the peripheral region B. A memory cell may be disposed in the string region A; and a peripheral circuit may be disposed in the peripheral region B.

A substrate 100 may have an active region defined by a device isolation layer ISO. The active region may include a portion of the substrate 100 surrounded by the device isolation layer ISO. The active region may extend in a first direction. The active region may include a channel region. A channel may be formed in the channel region when the semiconductor device is operated. The substrate 100 may include a semiconductor layer having a single crystalline structure.

The string region A may include a memory cell region CR and selection regions SR. The selection regions SR may be disposed at sides of the memory cell region CR. First conductive lines may be disposed on the memory cell region CR. The first conductive lines may be word lines WL. Second conductive lines may be disposed on the selection regions SR. Second conductive lines at one side of the memory cell region CR may be string selection lines SSL1 and SSL2. Second conductive lines at another side of the memory cell region CR may be ground selection lines GSL1 and GSL2.

The word lines WL, the string selection lines SSL1 and SSL2, and the ground selection lines GSL1 and GSL2 may extend in a second direction intersecting the first direction. The word lines WL may be between the string selection line SSLn and the ground selection line GSLn. The word lines WL, the string selection lines SSLn and the ground selection lines GSLn may be in parallel with each other. (n is 1 and/or 2)

A common source region 102 may be between a first ground selection line GSL1 and a second ground selection line GSL2. The common source region 104 may extend in the second direction. The common source region 104 may extend in parallel with the first and second ground selection lines GSL1 and GSL2. The common source region 104 may be formed in the substrate 100. The common source region 104 may include an impurity doped region in the substrate 100. Bit lines BL may cross over the word lines WL. The bit lines BL may extend in the first direction. The bit line BL may be connected through a contact plug CP to a common drain region 102 between a first string selection line SSL1 and a second string selection line SSL2.

The first string selection line SSL1, the first ground selection line GSL1, and the word lines WL between the first string selection line SSL1 and the first ground selection line GSL1 may be composed of cell strings. The cell string may be arranged symmetrically with respect to the contact plug CP and/or the common source region 104.

The word lines WL may be separated at first intervals on the memory cell region CR.

Figure 2B:
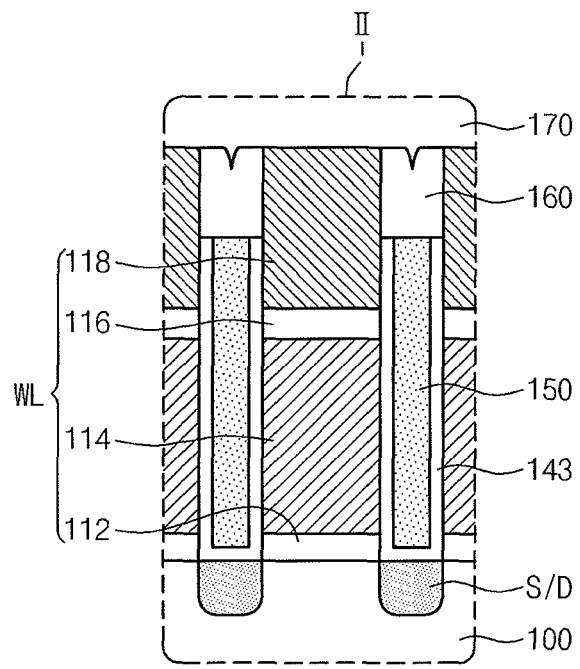
FIG. 2B illustrates a cross sectional view of a word line of the semiconductor device of FIG. 2A.

FIG. 2B illustrates a cross sectional view of a word line of the semiconductor device of FIG. 2A, e.g., an enlarged view of II in FIG. 2A.

Referring to FIG. 2B, the word line WL may include a tunnel insulating layer 112 on the active region, a charge storage layer 114 on the tunnel insulating layer 112, a blocking layer 116 on the charge storage layer 114, and a control gate electrode 118 on the blocking layer 116. The tunnel insulating layer 112, the charge storage layer 114, the blocking layer 116, and the control gate electrode 118 may be stacked sequentially on the substrate 100. The control gate electrode 118 on the blocking layer 116 and may cross over the active region in the second direction.

The tunnel insulating layer 112 may be monolayered or multilayered. The tunnel insulating layer 112 may include, e.g., a silicon oxynitride layer, a silicon nitride layer, a silicon oxide layer, and/or a metal oxide layer.

The charge storage layer 114 may include, e.g., doped polysilicon or undoped polysilicon. The charge storage layer 114 may include trap sites capable of storing electric charges. The charge storage layer 114 may include, e.g., a silicon nitride layer, a metal nitride layer, a metal oxynitride layer, a metal silicon oxide, a metal silicon oxynitride, and/or nanodots.

The blocking layer 116 may include a material having a dielectric constant higher than a dielectric constant of the tunnel insulating layer 112. The blocking layer 116 may include, e.g., a silicon oxide layer, a silicon nitride layer, a silicon oxynitride layer, and/or a high-k dielectric layer. The high-k dielectric layer may include, e.g., a metal oxide layer, a metal nitride layer, and/or a metal oxynitride layer. The high-k dielectric layer may include, e.g., hafnium, zirconium, aluminum, tantalum, lanthanum, cerium, and/or praseodymium.

The control gate electrode 118 may include, e.g., a doped polysilicon layer, a metal layer, a metal silicide layer, and/or metal nitride layer. The metal silicide layer may include, e.g., a tungsten silicide layer, a titanium silicide layer, a cobalt silicide layer, and/or a tantalum silicide layer. The metal nitride may include, e.g., titanium nitride and/or tantalum nitride.

Referring to FIG. 1 and FIG. 2A, the first and second string selection lines SSL1 and SSL2 may be disposed laterally on one of the selection regions SR and may be spaced apart at a second interval D2. The first and second ground selection lines GSL1 and GSL2 may be disposed laterally on another selection regions SR and may be spaced apart at the second interval D2. The second interval D2 may be wider than the first interval D1. The first string selection line SSL1 and the word line WL nearest the first string selection line SSL1 may be separated by the first interval D1. The first ground selection line GSL1 and the word line WL nearest the first ground selection line GSL1 may be separated by the first interval D1.

Figure 2C:
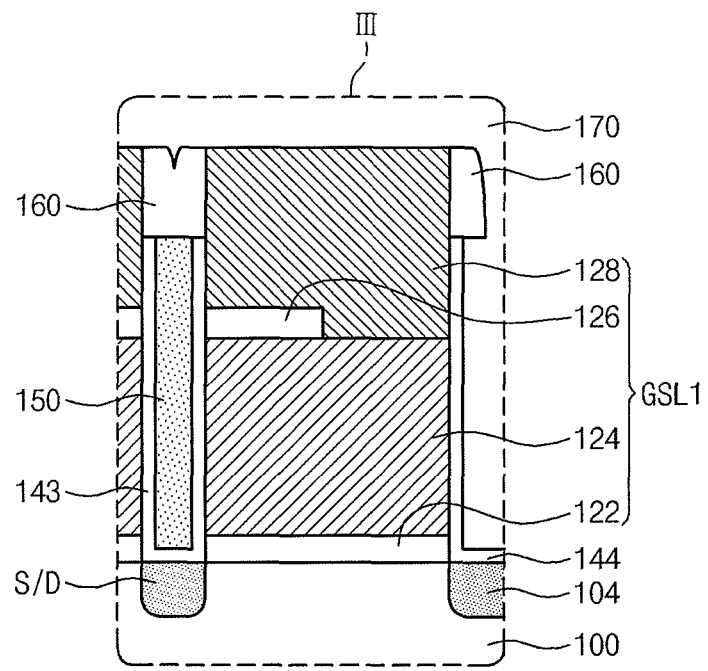
FIGS. 2C and 2D illustrate cross sectional views of a selection line of the semiconductor device of FIG. 2A.
Figure 2D:
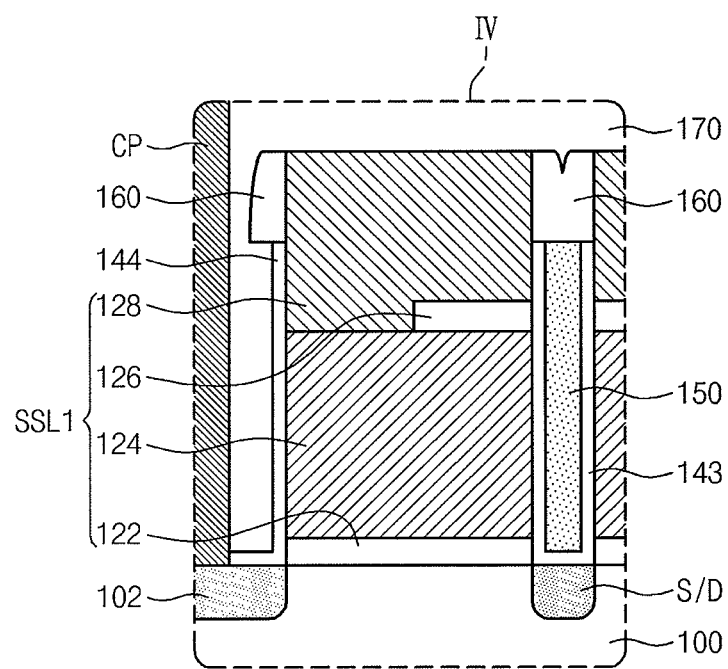

FIGS. 2C and 2D illustrate cross sectional views of a selection line of the semiconductor device of FIG. 2A, e.g., enlarged views of III and IV of FIG. 2A, respectively.

Referring to FIGS. 2C and 2D, each of the selection lines SSL1, SSL2, GSL1, and GSL2 may include a selection gate insulating layer 122 on the substrate 100, a selection gate interlayer insulating layer 126 on the selection gate insulating layer 122, and a selection gate electrode 124 and 128 on the selection gate insulating layer 122. The selection gate electrode 124 and 128 may include a lower selection gate electrode 124 and an upper selection gate electrode 128 on the lower selection gate electrode 124. The upper gate electrode 128 on the lower election gate electrode 124 may cross over the active region in the second direction.

The selection gate insulating layer 122, the lower selection gate electrode 124, the selection gate interlayer insulating layer 126, and the upper selection gate electrode 128 may include the same material as the tunnel insulating layer 112, the charge storage layer 114, the blocking layer 116 and the control gate electrode 118 of FIG. 2B, respectively. The selection gate interlayer insulating layer 126 may be narrower than the lower selection gate electrode 124 and the upper selection gate electrode 128. The lower selection gate electrode 124 may be in contact with the upper selection gate electrode 128.

Referring to FIG. 1 and FIG. 2A, a source/drain region S/D may be in the substrate 100 between the word lines WL. The source/drain region S/D may include an impurity doped region. Alternatively, the source/drain region S/D may include an inversion layer induced by an operation voltage applied to the control gate electrode 118. The inversion layer may be formed by a fringe field generated around the control gate electrode 118 caused by the operation voltage.

First dielectric layers 150 may be disposed at sides of the word lines WL between the first string selection line SSL1 and the first ground selection line GSL1. For example, the first dielectric layers 150 may be respectively disposed between the word lines WL, between the first string selection line SSL1 and the word line WL nearest the first string selection line SSL, and between the first ground selection line GSL1 and the word line WL nearest the first ground string selection line GSL1. The first dielectric layer 150 may be formed on the source/drain regions S/D.

A top surface of the first dielectric layer 150 may be below or lower than a top surface of the word line WL. The top surface of the first dielectric layer 150 may be below or lower than top surfaces of the string selection lines SSL1 and SSL2 as well as top surfaces of the ground selection lines GSL1 and GSL2. The top surface of the first dielectric layer 150 may be below or lower than a top surface of the control gate electrode 118 and above or higher than a top surface of the charge storage layer 114, as illustrated in FIG. 2B. The top surface of the first dielectric layer 150 may be above or higher than a top surface of the blocking layer 116, as illustrated in FIG. 2B. In an implementation, the top surface of the dielectric layer 150 may be below or lower than the top surface of the blocking layer 116 and above or higher than the top surface of the charge storage layer 114.

A dielectric constant of the first dielectric layer 150 may not exceed three (3), i.e., may be equal to or less than 3. The dielectric constant of the first dielectric layer 150 may be smaller than the dielectric constant of silicon oxide. The dielectric constant of the first dielectric layer 150 may be smaller than the dielectric constant of MTO (Middle Temperature Oxide). For example, the first dielectric layer 150 may include SiCOH (carbon doped silicon oxide).

A second dielectric layer 170 may be disposed between the string selection lines SSL1 and SSL2 and between the ground selection lines GSL1 and GSL2. The second dielectric layer 170 may cover entire top surfaces of the selection lines SSL1, SSL2, GSL1, and GSL2, as well as entire top surfaces of the word lines WL. A dielectric constant of the second dielectric layer 170 may be higher than that of the first dielectric layer 150. The second dielectric layer 170 may include, e.g., a silicon oxide layer.

First barrier insulating patterns 143 may be respectively disposed between the first dielectric layer 150 and the word lines WL, between the first dielectric layer 150 and the first string selection line SSL1, and between the first dielectric layer 150 and the first ground selection line GSL1. The first barrier insulating pattern 143 may be disposed between the first dielectric layer 150 and the substrate 100. Accordingly, the first dielectric layer 150 may be separated or spaced apart from the substrate 100, the word lines WL, and the first selection lines SSL1 and GSL1.

Second barrier insulating patterns 144 may be respectively disposed between the second dielectric layer 170 and the selection lines SSL1, SSl2, GSL1, and GSL2. The second barrier insulating pattern 144 may be disposed between the second dielectric layer 170 and portions of the substrate 100 between the first and second string selection lines SSL1 and SSL2. The second barrier insulating pattern 144 may be disposed between the second dielectric layer 170 and portions of the substrate 100 between the first and second ground selection lines GSL1 and GSL2. The second barrier insulating pattern 144 may include the same material as the first insulating pattern 143.

The barrier insulating patterns 143 and 144 may include a bottom portion in parallel with the substrate 100 as well as sidewall portions extending from side ends of the bottom portion and along the sidewalls of the word lines WL and the selection lines SSL1, SSL2, GSL1, and GSL2. The bottom portion and the sidewall portion of each barrier insulating patterns 143 and 144 may be continuous with each other. Each barrier insulating pattern 143 and 144 may have one body of the bottom portion and the sidewall portion. The bottom portion and the sidewall portion of each barrier insulating pattern 143 and 144 may be formed in the same process.

The bottom portion of the first barrier insulating pattern 143 may be disposed between the substrate 100 and the first dielectric layer 150. The bottom portion of the first barrier insulating pattern 143 may cover the source/drain region S/D. The bottom portion of the second barrier insulating pattern 144 may be disposed between the substrate 100 and the second dielectric layer 170. The bottom portion of the second barrier insulating pattern may cover the common drain region 102 and the common source region 104.

The sidewall portion of the first barrier insulating patterns 143 may be disposed respectively between the word lines WL and the first dielectric layers 150, between the first string selection line SSL1 and the first dielectric layer 150, and between the first ground selection line GSL1 and the first dielectric layer 150. A top surface of the sidewall portion of the first barrier insulating pattern 143 and the top surface of the sidewall portion of the second barrier insulating pattern 144 may be on the same level, e.g., may be substantially coplanar.

The top surface of the sidewall portion of the barrier insulating patterns 143 and 144 may be below or lower than top surfaces of the word line WL and the selection lines SSL1, SSL2, GSL1 and GSL2. The top surfaces of the sidewall portion of the barrier insulating pattern 143 and 144 and the top surface of the first dielectric layer 150 may be substantially on the same level, e.g. may be substantially coplanar. The top surfaces of the sidewall portion of the barrier insulating pattern 143 and 144 and the top surface of the first dielectric layer 150 may be substantially coplanar with each other. Alternatively, the top surfaces of the sidewall portion of the barrier insulating patterns 143 and 144 and the top surface of the first dielectric layer 150 may be on different levels.

The barrier insulating patterns 143 and 144 may include an insulating material. A dielectric constant of the barrier insulating patterns 143 and 144 may be higher than that of the first dielectric layer 150. For example, the barrier insulating patterns 143 and 144 may include a silicon oxide layer. In an implementation, the barrier insulating patterns 143 and 144 may include, e.g., a middle temperature oxide (MTO).

Spacers 160 may be disposed on the top surface of the first dielectric layer 150, the top surface of the sidewall portion of the first barrier insulating pattern 143, and the top surface of the sidewall portion of the second barrier insulating pattern 144, respectively.

The spacer 160 may cover the entire surface of the top surface of the first dielectric layer 150. The spacer 160 may cover the top surface of the sidewall portion of the barrier insulating patterns 143 and 144. The spacer 160 may fill spaces between the word lines WL. The spacer 160 may be in contact with sidewalls of the word lines WL and the selection lines SSL1, SSL2, GSL1, and GSL2.

The spacer 160 may include a material having an etching selectivity with respect to the first dielectric layer 150. For example, the spacer 160 may include a silicon oxide layer. The first dielectric layer 150 may have a dielectric constant smaller than that of the spacer 160. The second dielectric layer 170 may cover the spacer 160.

Referring to FIG. 2A, peripheral gate patterns PG may be disposed on the peripheral region B. The peripheral gate patterns PG may be separated at third intervals D3 on the peripheral region B. The third interval D3 may be wider than the first interval D1. The peripheral gate pattern PG may include a peripheral gate insulating layer 132 and a peripheral gate electrode 134 and 136 on the peripheral gate insulating layer 132. The peripheral gate electrode 134 and 136 may include a lower peripheral gate electrode 134 on the peripheral gate insulating layer 132 and an upper peripheral gate electrode 136 on the lower peripheral gate electrode 134.

The peripheral gate insulating layer 132, the lower peripheral gate electrode 134, and the upper peripheral gate electrode 136 may include the same material as the tunnel insulating layer 112, the charge storage layer 114, and the control gate electrode 118 of FIG. 2B, respectively.

A source/drain region S/D may be formed in the substrate 100 between adjacent peripheral gate patterns PG. The second dielectric layer 170 may be disposed between adjacent peripheral gate patterns PG and may cover the peripheral gate patterns PG. Third barrier insulating patterns 146 may be disposed respectively between the second dielectric layer 170 and the peripheral gate pattern PG and between the second dielectric layer 170 and the substrate 100.

The third barrier insulating pattern 146 may include a bottom portion in parallel with the substrate 100 and sidewall portions extending from side ends of the bottom portion and along the sidewall of the peripheral gate patterns PG. The bottom portion of the third barrier insulating pattern 146 may be disposed between the second dielectric layer 170 and the substrate 100. The sidewall portion of the third barrier insulating pattern 146 may be disposed between the second dielectric layer 170 and the peripheral gate pattern PG. A top surface of the sidewall portion of the third barrier insulating pattern 146 may be below or lower than a top surface of the peripheral gate pattern PG. The spacer 160 may cover the top surface of the sidewall portion of the third barrier insulating pattern 146. The third barrier insulating pattern 146 may include the same material as the first and second barrier insulating patterns 143 and 144.

According to the present embodiment, the first dielectric layer 150 may be disposed between the word lines WL and may have a dielectric constant smaller than the dielectric constant of silicon oxide. Thus, coupling between the word lines WL may be reduced, thereby providing a high performance semiconductor device.

Hereinafter, a method of fabricating a semiconductor device according to an embodiment will be described in detail with reference to FIGS. 3A through 3E.

Figure 3A:
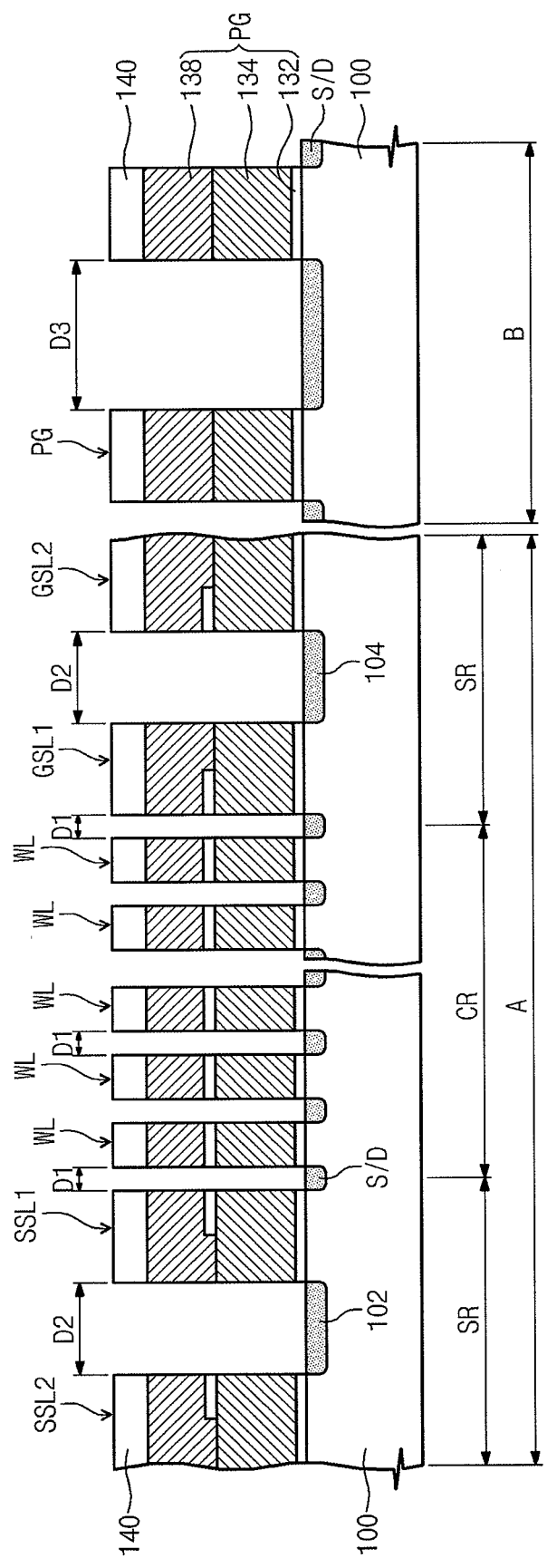
FIGS. 3A through 3E illustrate cross sectional views of stages in a method of fabricating a semiconductor device according to an embodiment.

Referring to FIG. 3A, a substrate 100 may be provided. The substrate 100 may include a silicon substrate, e.g., may have a single crystalline structure. The substrate 100 may include a string region A and a peripheral region B spaced apart from the string region A. The string region A may include a memory cell region CR and selection regions SR at sides of the memory cell region CR.

Word lines WL including a capping layer 140 may be formed on the memory cell region CR. The word lines WL may be spaced apart at first intervals D1 on the substrate 100. Selection lines SSL1, SSL2, GSL1, and GSL2 including a capping layer 140 may be formed on the selection region SR. The string selection lines SSL1 and SSL2 may be spaced apart at a second interval D2 on the substrate 100. The ground selection lines GSL1 and GSL2 may be spaced apart at the second interval D2 on the substrate 100. A peripheral gate pattern PG including a capping layer 140 may be formed on the peripheral region B. The capping layer 140 may include, e.g., a silicon oxide layer.

A method of forming the word lines WL, the selection lines SSL1, SSL2, GSL1, and GSL2 will be described with reference to FIGS. 2B through 2D.

Referring to FIG. 2B, forming the word lines WL may include forming a tunnel insulating layer 112 on the substrate, forming a charge storage layer 114 on the tunnel insulating layer 112, forming a blocking layer 116 on the charge storage layer 114, and forming a control gate electrode 118 on the blocking layer 116.

Referring to FIGS. 2C and 2D, forming the selection lines SSL1, SSL2, GSL1, and GSL2 may include forming a selection gate insulating layer 122 on the substrate 100, forming a lower selection gate electrode 124 on the selection gate insulating layer 122, forming a selection gate interlayer insulating layer 126 on the lower selection gate electrode 124, and forming an upper selection gate electrode 128 on the lower selection gate electrode 124.

Referring to FIG. 3A, forming the peripheral gate pattern PG may include forming a peripheral gate insulating layer 132 on the substrate 100, forming a lower peripheral gate electrode 134 on the peripheral gate insulating layer 132, and forming an upper peripheral gate electrode 138 on the lower peripheral gate electrode 134.

The tunnel insulating layer 112, the selection gate insulating layer 122, and the peripheral gate insulating layer 132 may be formed in the same process. The charge storage layer 114, the lower selection gate electrode 124, and the lower peripheral gate electrode 134 may be formed in the same process. The blocking layer 116 and the selection gate interlayer insulating layer 126 may be formed in the same process. The control gate electrode 118, the upper selection gate electrode 128, and the upper peripheral gate electrode 138 may be formed in the same process.

A source/drain region S/D may be formed in the substrate 100 between the word lines WL. A common drain region 102 may be formed in the substrate 100 between the string selection lines SSL1 and SSL2. A common source region 104 may be formed in the substrate 100 between the ground selection lines GSL1 and GSL2. The source/drain region S/D, the common drain region 102, and the common source region 104 may include impurity doped regions, respectively.

Figure 3B:
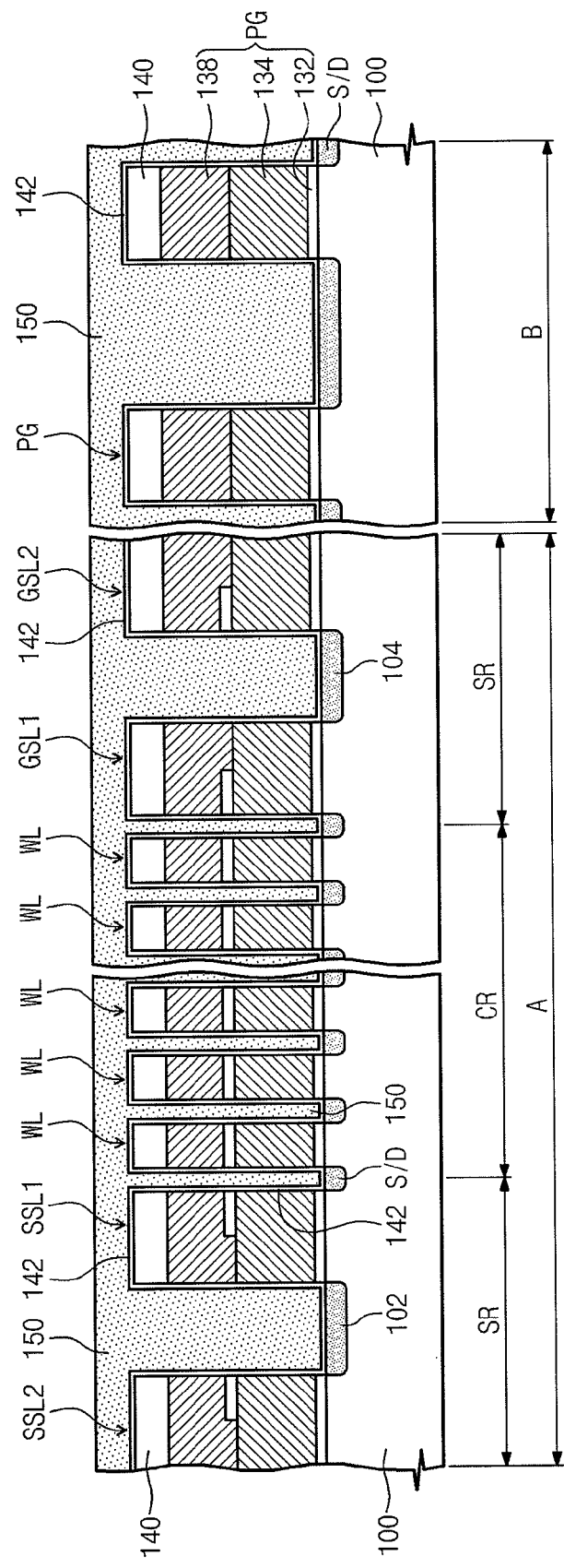

Referring to FIG. 3B, a barrier insulating layer 142 may be formed to conformally cover the word lines WL, the selection lines (SSL1, SSL2, GSL1, and GSL2), the peripheral gate pattern PG, and the capping layer 140. The barrier insulating layer 142 may cover portions of the substrate 100 between the word lines WL, the selection lines SSL1, SSL2, GSL1, and GSL2, and the peripheral gate pattern PG. The barrier insulating layer 142 may fill a portion of the spaces between the word lines WL, between the string selection lines SSL1 and SSL2, between the ground selection lines GSL1 and GSL2, and between adjacent peripheral gate patterns PG. The barrier insulating layer 142 may include, e.g., a middle temperature oxide (MTO).

A first dielectric layer 150 may be formed on the barrier insulating layer 142. The barrier insulating layer 142 may separate the first dielectric layer 150 from the substrate 100, the word lines WL, the selection lines SSL1, SSL2, GSL1, and GSL2, and the peripheral gate pattern PG. A thermal treatment may be performed on the first dielectric layer 150. The thermal treatment may be performed under a nitrogen atmosphere.

The first dielectric layer 150 may fill spaces between the word lines WL, the string selection lines SSL1 and SSL2, the ground selection lines GSL1 and GSL2, and the peripheral gate patterns PG. The first dielectric layer 150 may cover top surfaces of the word lines WL, the selection lines SSL, SSL2, GSL1 and GSL2, and the peripheral gate patterns PG.

The first dielectric layer 150 may have a dielectric constant of about 3 or lower. For example, the first dielectric layer may include carbon doped silicon oxide (SiCOH). The first dielectric layer may have a critical temperature at which material properties are changed. For example, the dielectric constant of the first dielectric layer 150 may be changed at the critical temperature.

Figure 3C:
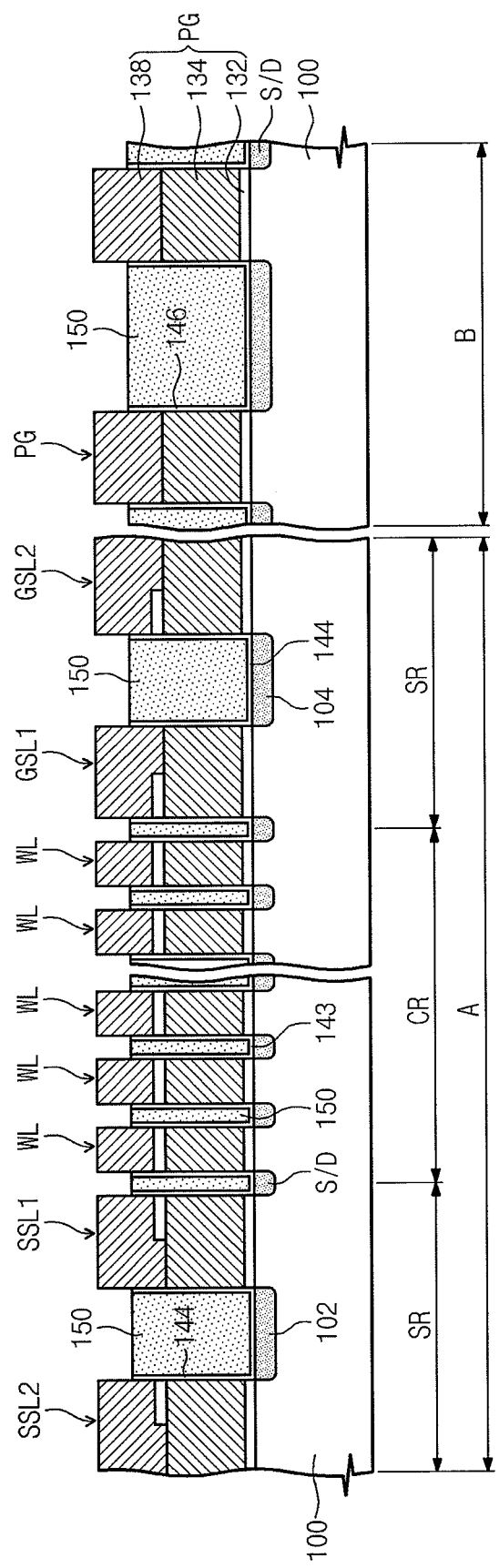

Referring to FIG. 3C, a planarization process may be performed using the capping layer 140 as an etching stop layer. The planarization process may include, e.g., an etch-back process or a chemical mechanical polishing (CMP) process. The capping layer 140, the barrier insulating layer 142, and the first dielectric layer 150 may be etched after the planarization process. The barrier insulating layer 142 and the first dielectric layer 150 may be etched simultaneously.

The capping layer 140, the barrier insulating layer 142, and the first dielectric layer 150 may be etched to expose the word lines WL, the selection lines SSL1, SSL2, GSL1, and GSL2, and the peripheral gate pattern PG. For example, the control gate electrode 118, the upper selection gate electrode 128, and the upper peripheral gate electrode 138 (see FIG. 2A through FIG. 2D) may be exposed. A top surface of the etched first dielectric layer 150 may be below or lower than top surfaces of the word lines WL, the selection lines SSL1, SSL2, GSL1, and GSL2, and the peripheral gate pattern PG. The top surface of the etched first dielectric layer 150 may be above or higher than a top surface of the charge storage layer 114 and below a top surface of the control gate electrode 118.

The barrier insulating layer 142 may be etched to form first barrier insulating patterns 143 between the word lines WL, between the first selection line SSL1 and one word line WL nearest to the first selection line SSL, and between the second selection line SSL2 and one word line WL nearest to the second selection line SSL2. The barrier insulating layer 142 may be etched to form second barrier insulating patterns 144 between the string selection lines SSL1 and SSL2 and between the ground selection lines GSL1 and GSL2. The barrier insulating layer 142 may be etched to form a third barrier insulating pattern 146 between adjacent peripheral gate patterns PG.

Each of the barrier insulating patterns 143, 144, and 146 may include a bottom portion in parallel with the substrate 100 and sidewall portions extending from side ends of the bottom portion. Top surfaces of the sidewall portions of the barrier insulating patterns 143, 144, and 146 may be on substantially the same level or coplanar with the top surface of the etched dielectric layer 150.

Figure 3D:
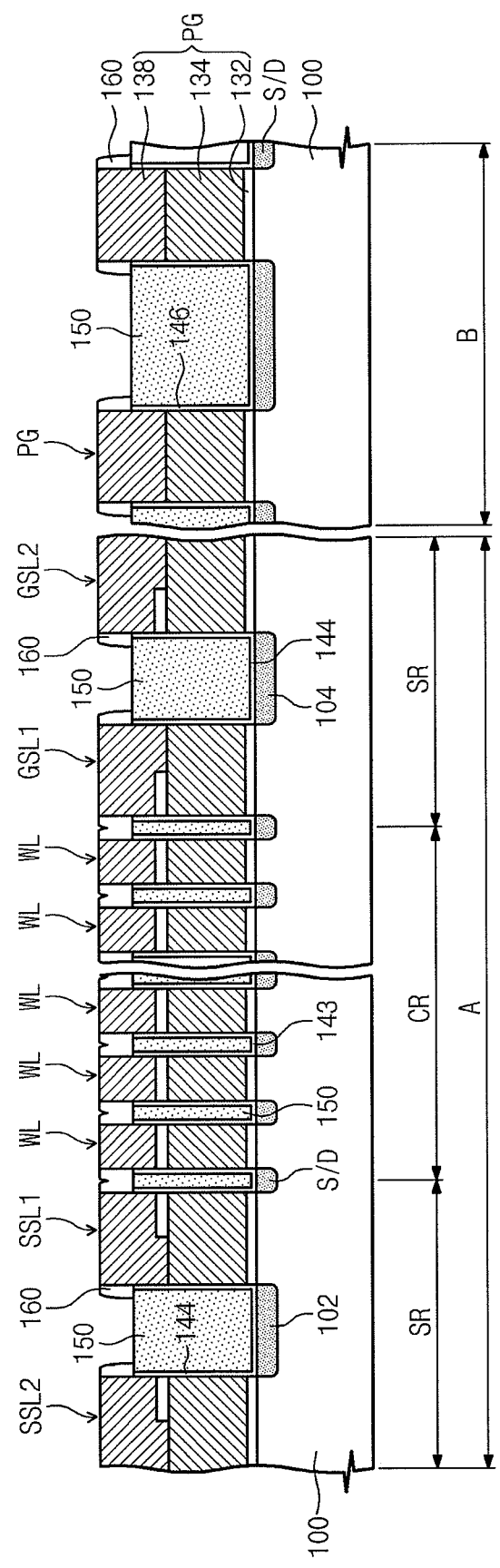

Referring to FIG. 3D, spacers 160 may be formed on the top surfaces the sidewalls of the barrier insulating patterns 143, 144, and 146 and the etched first dielectric layer 150. Forming the spacer 160 may include forming a spacer layer on an entire surface of the substrate 100 and etching the spacer layer. The spacer layer may be formed at a temperature lower than the critical temperature of the first dielectric layer 150. For example, the spacer layer may be formed by an atomic layer deposition (ALD) process. Etching of the spacer layer may be performed during the anisotropic etching process.

The spacer 160 may cover portions of the etched first dielectric layer 150 between the string selection lines SSL1 and SSL2, between the ground selection lines GSL1 and GSL2, and between adjacent peripheral gate patterns PG. Portions of the etched first dielectric layers layer 150 between the string selection lines SSL1 and SSL2, between the ground selection lines GSL1 and GSL2, and between adjacent peripheral gate patterns PG may be exposed between the spacers 160. The spacers 160 may cover the entire top surface of the etched first dielectric layers layer 150 between the word lines WL, between the first string selection line SSL1 and one word line WL nearest to the first string selection line SSL1, and between the first ground selection line GSL1 and another word line WL nearest to the first ground selection line GSL1, respectively.

Figure 3E:
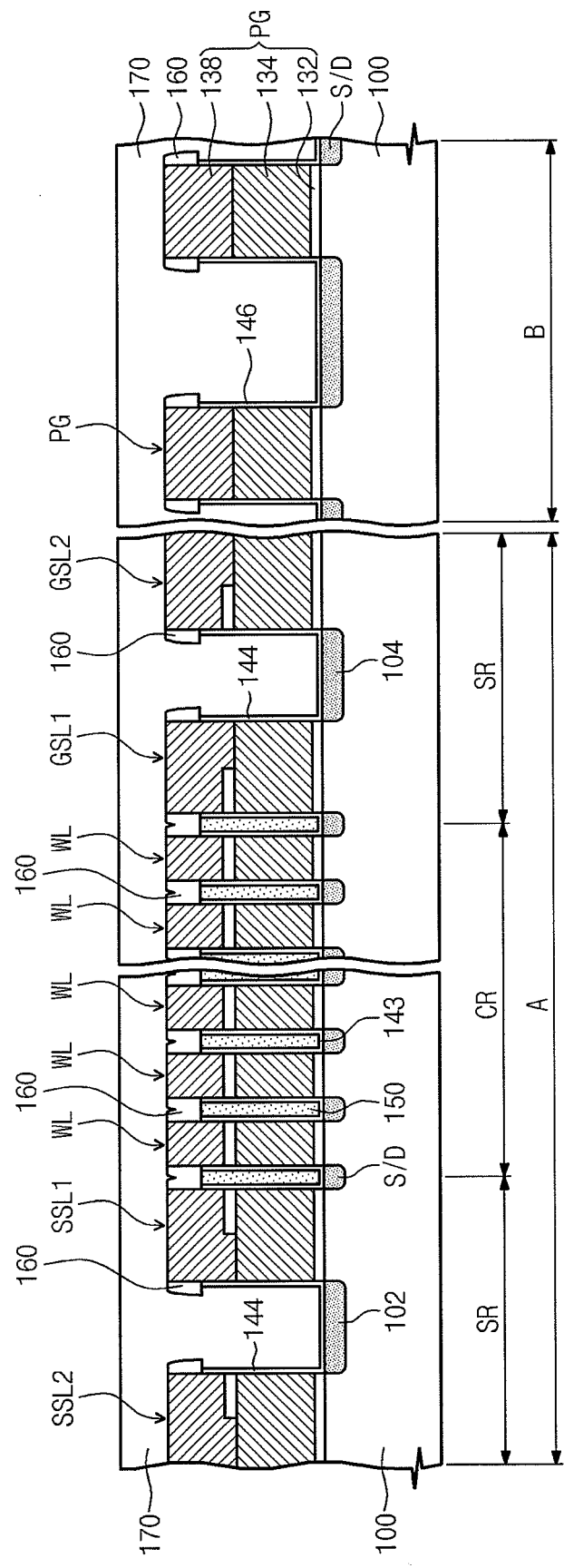

Referring to FIG. 3E, portions of the etched first dielectric layer 150 exposed between the spacers 160 may be removed. For example, the etched first dielectric layer 150 between the string selection lines SSL1 and SSL2, between the ground selection lines GSL1 and GSL2, and between the adjacent peripheral gate patterns PG may be removed. The etched first dielectric layer 150 between the word lines WL, between the first string selection line SSL1 and one word line WL nearest to the first string selection line SSL1, and between the first ground selection line GSL1 and another word line WL nearest to the first ground selection line GSL1, respectively, may remain, The first dielectric layer 150 may be removed to expose the second and the third barrier insulating patterns 144 and 146 between the string selection lines SSL1 and SSL2, between the ground selection lines GSL1 and GSL2, and between the adjacent peripheral gate patterns PG.

A second dielectric layer 170 may fill spaces between the string selection lines SSL1 and SSL2, between the ground selection lines GSL1 and GSL2, and between the adjacent peripheral gate patterns PG. The second dielectric layer 170 may cover the top surfaces of the word lines WL, the selection lines SSL1, SSL2, GSL1 and GSL2, and the peripheral gate patterns PG. A dielectric constant of the second dielectric layer 170 may be higher than that of the first dielectric layer 150. For example, the second dielectric layer 170 may include a silicon oxide layer.

Referring to FIG. 2A, a contact plug CP may be connected to the common drain region 102 in the substrate 100 between the string selection lines SSL1 and SSL2 through the second dielectric layer 170. Thus, a semiconductor device according to an embodiment may be formed.

A semiconductor device according to another embodiment will be described.

Figure 4A:
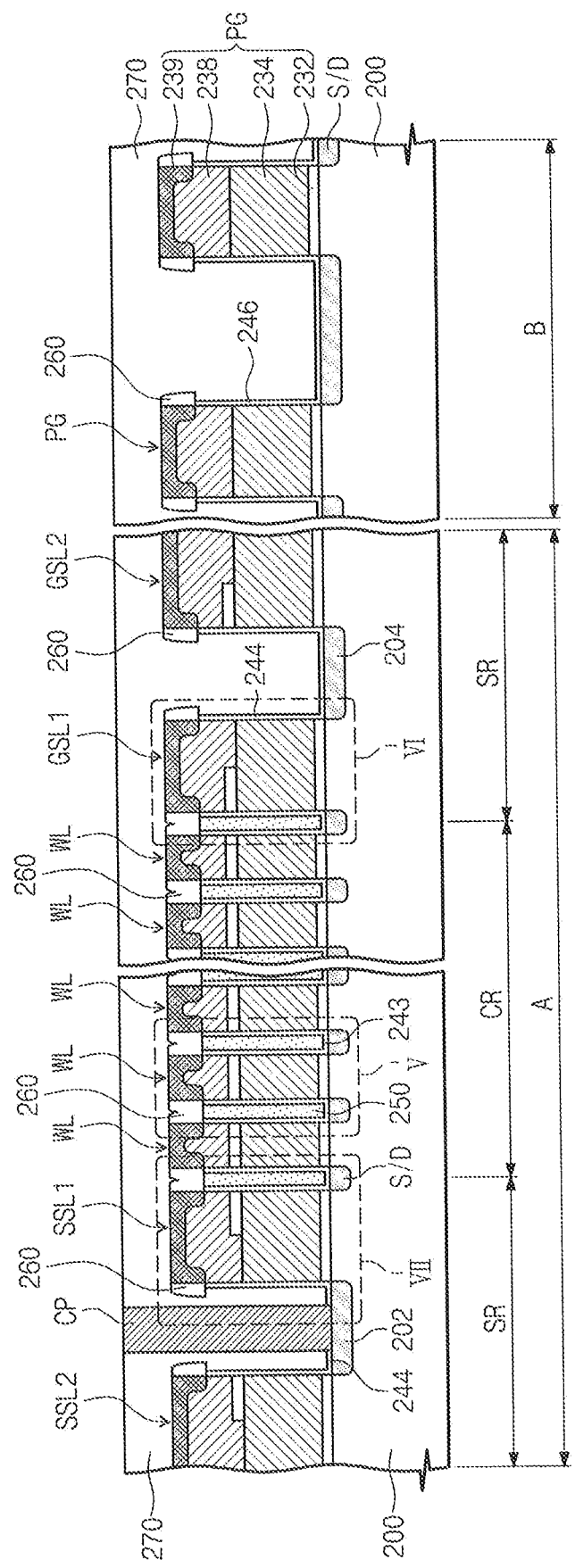
FIG. 4A illustrates a cross sectional view of a semiconductor device according to another embodiment.

FIG. 4A illustrates a cross sectional view of a semiconductor device according to another embodiment.

The device may include a string region A and a peripheral region B spaced apart from the string region B.

Referring to FIGS. 1 and 4A, a memory cell may be disposed in the string region A; and a peripheral circuit may be disposed in the peripheral region B.

A substrate 200 may include an active region defined by a device isolation layer ISO. The active region may be defined in the substrate 200. The active region may extend in a first direction.

The string region A may include a memory cell region CR and selection regions SR. The selection regions SR may be disposed at sides of the memory cell region CR. Word lines WL may be disposed on the memory cell region CR. Source/drain regions S/D may be disposed in the substrate 200 between adjacent word lines WL. String selection lines SSL1 and SSL2 may be disposed on the selection regions SR at a side of the memory cell region CR. Ground selection lines GSL1 and GSL2 may be disposed on selection regions SR at another side of the memory cell region CR. The word lines WL, the string selection lines SSL1 and SSL2, and the ground selection lines GSL1 and GSL2 may extend in a second direction intersecting the first direction. A common source region 204 may be disposed between the first ground selection line GSL1 and the second ground selection line GSL2. Bit lines BL may cross over the word lines WL. The bit lines BL may extend in the first direction. The bit line BL may be connected through a contact plug CP to a common drain region 202 between a first string selection line SSL1 and a second string selection line SSL2.

The word lines WL may be disposed on the memory cell region CR at first intervals D1.

Figure 4B:
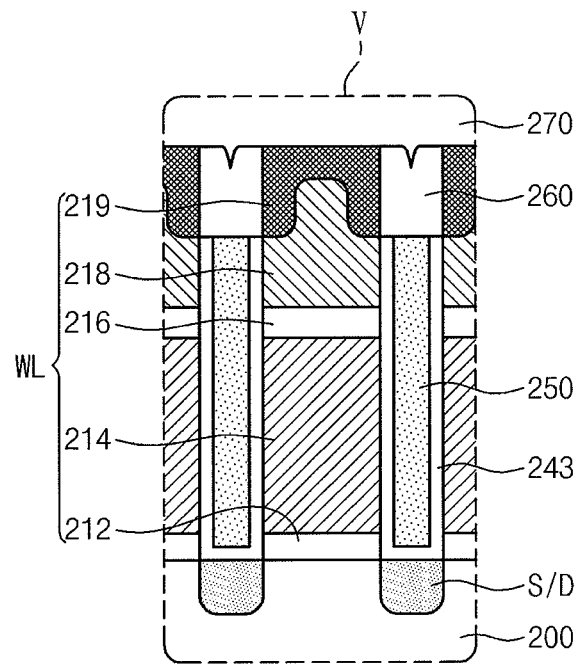
FIG. 4B illustrates a cross sectional view of a word line of the semiconductor device of FIG. 4A.

FIG. 4B illustrates an enlarged view of a portion V of FIG. 4A, e.g., a word line of the semiconductor device of FIG. 4A.

Referring to FIG. 4B, the word line WL may include a tunnel insulating layer 212 on the active region, a charge storage layer 214 on the tunnel insulating layer 212, a blocking layer 216 on the charge storage layer 214, a lower control gate electrode 218 on the blocking layer 216, and an upper control gate electrode 219 on the lower control gate electrode 218. The tunnel insulating layer 212, the charge storage layer 214, the blocking layer 216, the lower control gate electrode 218, and the upper control gate electrode 219 may be disposed sequentially on the substrate 200. The control gate electrodes 218 and 219 on the blocking layer 216 may cross over the active region in the second direction.

The tunnel insulating layer 212, the charge storage layer 214, and the blocking layer 216 may be formed of the same materials as the tunnel insulating layer 112, the charge storage layer 114, and the blocking layer 116 of FIG. 2B, respectively. The lower control gate electrode 218 may include polysilicon; and the upper control gate electrode 219 may include metal silicide. For example, the upper control gate electrode 219 may include a cobalt silicide layer.

Referring to FIGS. 1 and 4A, the first and the second string selection lines SSL1 and SSL2 may be disposed on a selection region SR and may be spaced apart at a second interval D2. The first and the second ground selection lines GSL1 and GSL2 may be disposed on another selection region SR and may be spaced apart at the second interval D2. The second interval D2 may be wider than the first interval D1.

Figure 4C:
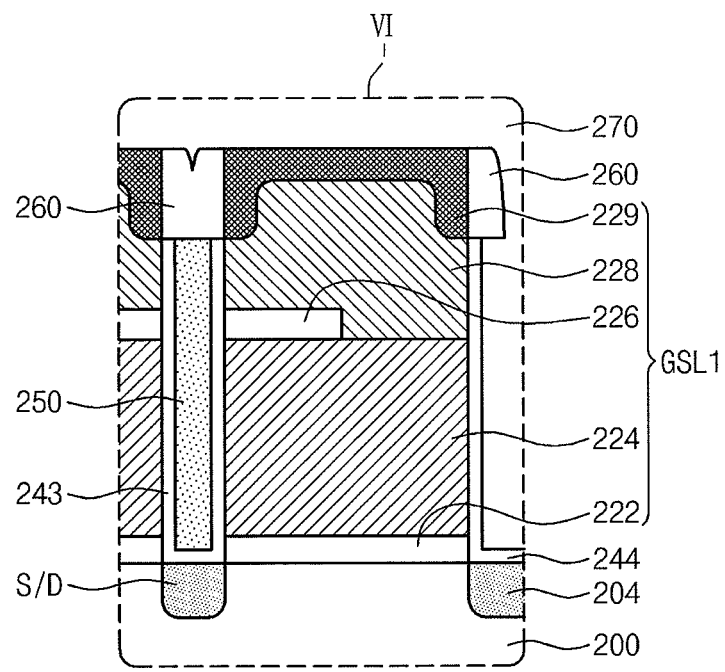
FIGS. 4C and 4D illustrate cross sectional view of a selection line of the semiconductor device of FIG. 4A.
Figure 4D:
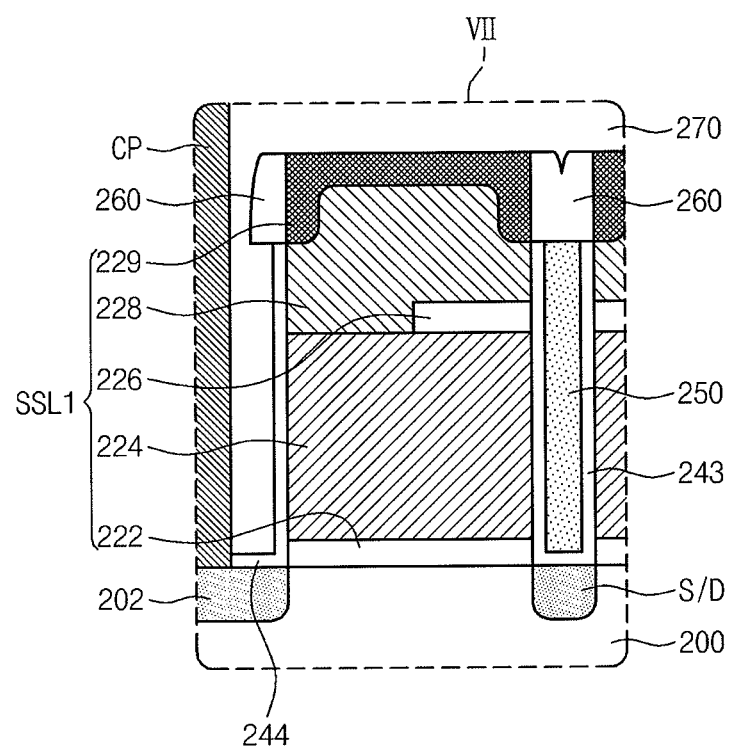

FIGS. 4C and 4D respectively illustrate enlarged views of regions VI and VII of FIG. 4A, e.g. selection lines of the semiconductor device of FIG. 4A.

Referring to FIGS. 4C and 4D, the selection lines SSL1, SSL2, GSL1, and GSL2 may include a selection gate insulating layer 222 on the substrate 200, a selection gate interlayer insulating layer 226 on the selection gate insulating layer 222, and selection gate electrodes 224, 228, and 229 on the selection gate insulating layer 222. The selection gate electrode may include a lower selection gate electrode 224, a first upper selection gate electrode 228 on the lower selection gate electrode 224, and a second upper selection gate electrode 229 on the first upper selection gate electrode 228. The upper selection gate electrodes 228 and 229 on the lower selection gate electrode 224 may cross over the active region in the second direction.

The selection gate insulating layer 222, the lower selection gate electrode 224, the selection gate interlayer insulating layer 226, the first upper selection gate electrode 228, and the second upper selection gate electrode 229 may be formed of the same materials as the tunnel insulating layer 212, the charge storage layer 214, the blocking layer 216, the lower control gate electrode 218, and the upper control gate electrode 219, respectively.

Referring to FIGS. 1 and 4A, a first dielectric layer 250 may be disposed between adjacent word lines WL. The first dielectric layer 250 may be disposed between the first string selection line SSL1 and the word line WL nearest to the first string selection line SSL1. The first dielectric layer 250 may be disposed between the first ground selection line GSL1 and the word line WL nearest to the first ground selection line GSL1.

The top surface of the first dielectric layer 250 may be below or lower than the top surface of the word line WL. The top surface of the first dielectric layer 250 may be below or lower than top surfaces of the string selection lines SSL1 and SSL2 and the ground selection lines GSL1 and GSL2. The top surface of the first dielectric layer 250 may be below or lower than the top surface of the upper control gate electrode 219 of FIG. 4B and may be above of higher than the top surface of the charge storage layer 214 of FIG. 4B. The top surface of the first dielectric layer 250 may be above or higher than the top surface of the blocking layer 216 of FIG. 4B. The top surface of the first dielectric layer 250 may be substantially level or coplanar with a lowest surface of the upper control gate electrode 219.

Alternatively, the top surface of the first dielectric layer 250 may be above or higher than the lowest surface of the upper control gate electrode 219. Although not illustrated in the drawing, the top surface of the first dielectric layer 250 may be below or lower than the top surface of the blocking layer 216 and above or higher than the top surface of the charge storage layer 214.

The dielectric constant of the first dielectric layer 250 may be equal to or less than 3. The dielectric constant of the first dielectric layer 250 may be smaller than the dielectric constant of silicon oxide. For example, the first dielectric layer may include SiCOH.

Second dielectric layers 270 may be respectively disposed between the string selection lines SSL1 and SSL2 and the ground selection lines GSL1 and GSL2. The second dielectric layer 270 may cover an entire top surface of the selection lines SSL1, SSL2, GSL1, and GSL2 as well as an entire top surface of the word lines WL. The dielectric constant of the second dielectric layer 270 may be higher than that of the first dielectric layer 250. In an implementation, the second dielectric layer 270 may include, e.g., silicon oxide.

First barrier insulating patterns 243 may be disposed between the first dielectric layer 250 and the word line WL, between the first dielectric layer 250 and the first string selection line SSL1, and between the first dielectric layer 250 and the first ground selection line GSL1, respectively. The first barrier insulating pattern 243 may be disposed between the first dielectric layer 250 and portions of the substrate 200. The first dielectric layer 250 may be spaced apart from the substrate 200, the word lines WL, and the first selection lines SSL1 and GSL1 by the first barrier insulating pattern 243.

Second barrier insulating patterns 244 may be disposed between the second dielectric layer 270 and the selection lines SSL1, SSL2, GSL1, and GSL2, respectively. The second barrier insulating pattern 244 may be disposed between the second dielectric layer 270 and portions of the substrate 200 between the first and the second string selection lines SSL1 and SSL2. The second barrier insulating pattern 244 may be disposed between the second dielectric layer 270 and portions of the substrate 200 between the first and the second ground selection lines GSL1 and GSL2. The second barrier insulating pattern 244 may include the same material as the first barrier insulating pattern 243.

Each of the barrier insulating patterns 243 and 244 may include a bottom portion in parallel with the substrate 200 and sidewall portion extending from ends of the bottom portion and along the side wall of the word line WL or the selection line SSL1, SSL2, GSL1, or GSL2. The bottom portions and the sidewall portions of the barrier insulating patterns 143 and 144 may be formed simultaneously.

The bottom portion of the first barrier insulating pattern 243 may be disposed between the substrate 200 and the first dielectric layer 250. The bottom surface of the second barrier insulating pattern 244 may be disposed between the substrate 200 and the second dielectric layer 270.

Each sidewall portion of the first barrier insulating pattern 243 may be disposed between the word line WL and the first dielectric layer 250, between the first string selection line SSL1 and the first dielectric layer 250, and between the first ground selection line GSL1 and the first dielectric layer 250. The top surface of the sidewall portion of the first barrier insulating pattern 243 may be substantially level or coplanar with the top surface of the sidewall portion of the second barrier insulating pattern 244. The top surface of the sidewall portion of the first barrier insulating pattern 243, the top surface of the first dielectric layer 250, and the lowest surface of the lower control gate electrode 219 may be substantially level or coplanar.

The barrier insulating patterns 243 and 244 may include insulating material. For example, the barrier insulating patterns 243 and 244 may include middle temperature oxide (MTO).

Spacers 260 may be disposed on the top surface of the first dielectric layer 250, the top surface of the sidewall portion of the first barrier insulating pattern 243, and the top surface of the sidewall portion of the second barrier insulating pattern 244, respectively.

The spacer 260 may cover an entire top surface of the first dielectric layer 250. The spacer 260 may cover the top surface of the sidewall portion of the first barrier insulating pattern 243. The spacer 260 may fill spaces between adjacent word lines WL. The spacer 260 may be in contact with the word line WL and the sidewall of the selection line SSL1, SSL2, GSL1, and GSL2.

The spacer 260 may include a material having etching selectivity to the first dielectric layer 250. For example, the spacer 260 may include silicon oxide. The second dielectric layer 270 may cover the spacer 260.

The peripheral region B of the semiconductor device according to the present embodiment will now be described.

Peripheral gate patterns PG may be disposed on the peripheral region B. The peripheral gate patterns PG may be disposed on the peripheral region B and may be spaced apart at a third interval D3. The third interval D3 may be wider than the first interval D1. The peripheral gate pattern PG may include a peripheral gate insulating layer 232 and peripheral gate electrode 234, 238, and 239 on the peripheral gate insulating layer 232. The peripheral gate electrode may include a lower peripheral gate electrode 234 on the peripheral gate insulating layer 232, a first upper peripheral gate electrode 238 on the lower peripheral gate electrode 234, and the second upper peripheral gate electrode 239 on the first upper peripheral gate electrode 238.

The peripheral gate insulating layer 232, the lower peripheral gate electrode 234, the first upper peripheral gate electrode 238, and the second upper peripheral gate electrode 239 may be formed of the same materials as the tunnel insulating layer 212, the charge storage layer 214, the lower control gate electrode 218, and the upper control gate electrode 219, respectively.

The second dielectric layer 270 may be disposed between the peripheral gate patterns PG and may cover the peripheral gate patterns PG. Third barrier insulating patterns 246 may be disposed between the second dielectric layer 270 and the peripheral gate pattern PG as well as between the second dielectric layer 270 and portions of the substrate 200, respectively.

The third barrier insulating pattern 246 may have a bottom portion in parallel with the substrate 200 and sidewall portions extending from side ends of the bottom portion along a sidewall of the peripheral gate pattern PG. The bottom portion of the third barrier insulating pattern 246 may be disposed between the second dielectric layer 270 and the substrate 200. The sidewall portion of the third barrier insulating pattern 246 may be disposed between the second dielectric layer 270 and the peripheral gate pattern PG. The top surface of the sidewall portion of the third barrier insulating pattern 246 may be below or lower than the top surface of the peripheral gate pattern PG. The top surface of the sidewall portion of the third barrier insulating pattern 246 may be substantially level or coplanar with a lowest portion of a bottom surface of the second upper peripheral gate electrode 239. The spacer 260 may cover the top surface of the sidewall portion of the third barrier insulating pattern 246. The third barrier insulating pattern 246 may include the same material as the first and the second barrier insulating patterns 243 and 244.

A method of fabricating a semiconductor device according to another embodiment will be described.

Figure 5A:
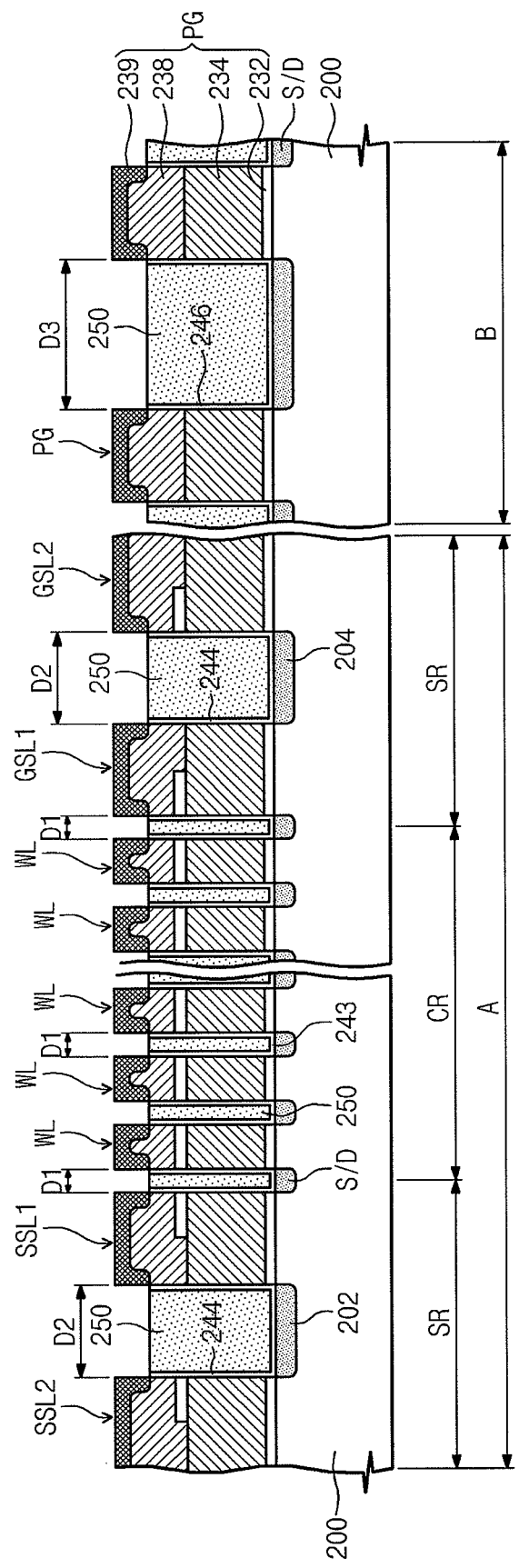
Figure 5B:
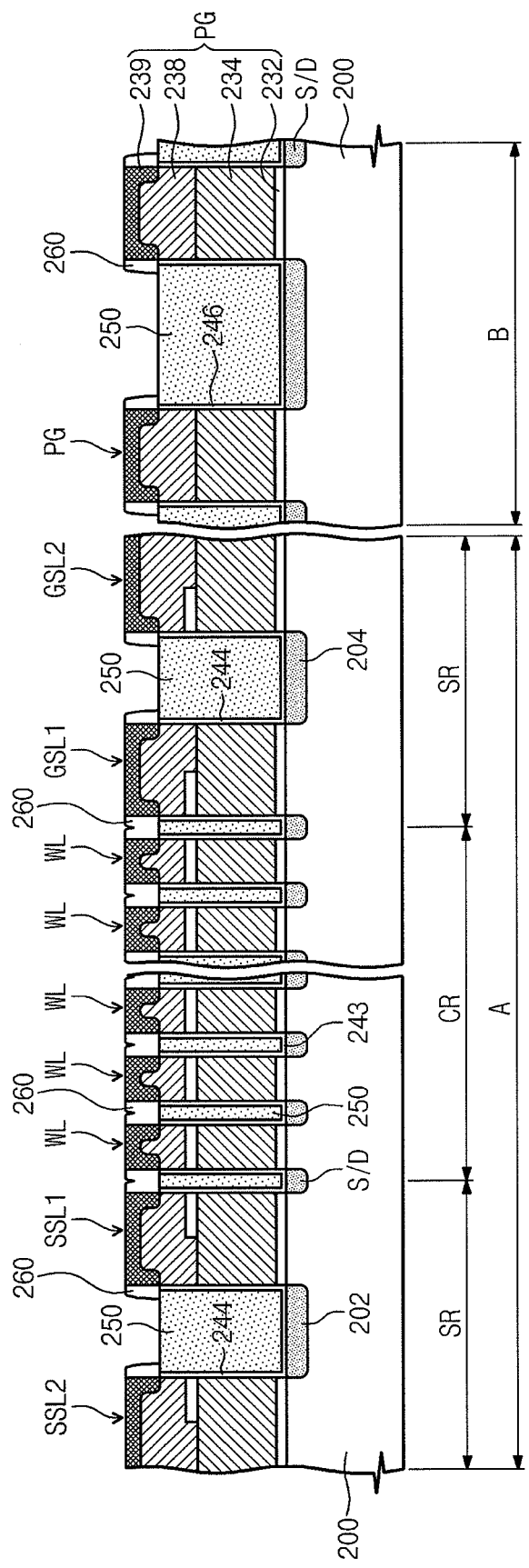

FIGS. 5A through 5C illustrate stages in a method of fabricating a semiconductor device according to another embodiment.

Referring to FIG. 5A, a substrate 200 may be provided. The substrate 200 may include a string region A and a peripheral region B spaced apart from the string region A. The string region A may include a memory cell region CR and selection regions SR at sides of the memory cell region CR. The substrate 200 may be the same as the substrate 100 of FIG. 3A.

Word lines WL, selection lines SSL1, SSL2, GSL1, and GSL2, peripheral gate patterns PG, source/drain regions S/D, common drain regions 202, and common source regions 204 may be disposed on the substrate 200 as described with reference to FIG. 3A. As described with reference to the barrier insulating layer 142 and the first dielectric layer 150 of FIG. 3B, a barrier insulating layer 242 may be formed, and a first dielectric layer 250 may be formed on the barrier insulating layer 242. As described with reference to the first, second, and third barrier insulating pattern 143, 144, and 146 of FIG. 3C, the barrier insulating layer 242 and the first dielectric layer 250 may be etched to form a first barrier insulating pattern 243, a second barrier insulating pattern 244, and a third barrier insulating pattern 246 exposing portions of the word lines WL, the selection lines SSL1, SSL2, GSL1, and GSL2, and the peripheral gate pattern PG. A top surface of the etched first dielectric layer 250 may be above or higher than the top surface of the charge storage layer 214 as illustrated in FIG. 4B. The top surface of the etched first dielectric layer 250 may be on substantially the same level or coplanar with the top surface of the sidewall portion of the first barrier insulating pattern 243.

The exposed word lines WL, selection lines SSL1, SSL2, GSL1, and GSL2, and peripheral gate patterns PG may be metal silicided. For example, portions of the upper control gate electrode 218, the first upper selection gate electrode 228, and the first upper peripheral gate electrode 238 (which have been described above with respect to FIGS. 4B through 4D), may be exposed and silicided to form the upper control gate electrode 219, the second upper selection gate electrode 229, and the second peripheral gate electrode 239. The lowest surfaces of the upper control gate electrode 219, the second upper selection gate electrode 229, and the second upper peripheral gate electrode 239, which have been described above with respect to FIGS. 4B through 4D, may be on the same level or coplanar with the top surface of the etched first dielectric layer 250. Alternatively, the lowest surfaces of the upper control gate electrode 219, the second upper selection gate electrode 229, and the second upper peripheral gate electrode 239 may be below or lower than the top surface of the etched first dielectric layer 250.

Referring to FIG. 5B, a spacer 260 may be formed on top surfaces of the etched first dielectric layer 250 and the sidewall portion of the etched barrier insulating patterns 243, 244, and 246. The spacer 260 may be formed by the method which has been described above with reference to the spacer 160 of FIG. 3D. The spacers 260 may cover portions of the first dielectric layers 250 between the string selection lines SSL1 and SSL2, between the ground selection lines GSL1 and GSL2, and between adjacent peripheral gate patterns PG, respectively. The spacer 260 may cover an entire surface of the etched first dielectric layer 250 between adjacent word lines WL. The spacers 260 may cover the entire surfaces of the etched first dielectric layers 250 between the first string selection line SSL1 and the word line WL nearest to the first string selection line SSL1 and between the first ground selection line GSL1 and the word line WL nearest to the first ground selection line GSL, respectively.

Referring to FIG. 5C, portions of the etched first dielectric layer 250 exposed between the spacers 260 may be removed. The etched first dielectric layer 250 may be removed by the method which has been described above with reference to FIG. 3E. For example, portions of the etched first dielectric layers 250 between the string selection lines SSL1 and SSL2, between the ground selection lines GSL1 and GSL2, and between adjacent peripheral gate patterns PG may be removed. The portions of the etched first dielectric layer 250 may be removed to expose the second and the third barrier insulating patterns 244 and 246 between the string selection lines SSL1 and SSL2, between the ground selection lines GSL1 and GSL2, and between adjacent peripheral gate patterns PG.

Referring again to FIG. 4A, a second dielectric layer 270 may fill spaces between the string selection lines SSL1 and SSL2, between the ground selection lines GSL1 and GSL2, and between adjacent peripheral gate patterns PG. The second dielectric layer 270 may cover the top surfaces of the word lines WL, the selection lines SSL1, SSL2, GSL1 and GSL2, and the peripheral gate pattern PG. The dielectric constant of the second dielectric layer 270 may be higher than that of the first dielectric layer.

A contact plug CP may be connected with the common drain region 202 in the substrate 200 between the string selection lines SSL1 and SSL2 through the second dielectric layer 270 and the second barrier insulating pattern 244. Thus, the semiconductor device according to an embodiment may be completed.

Applications of the semiconductor device according to embodiments will be described.

Figure 6:
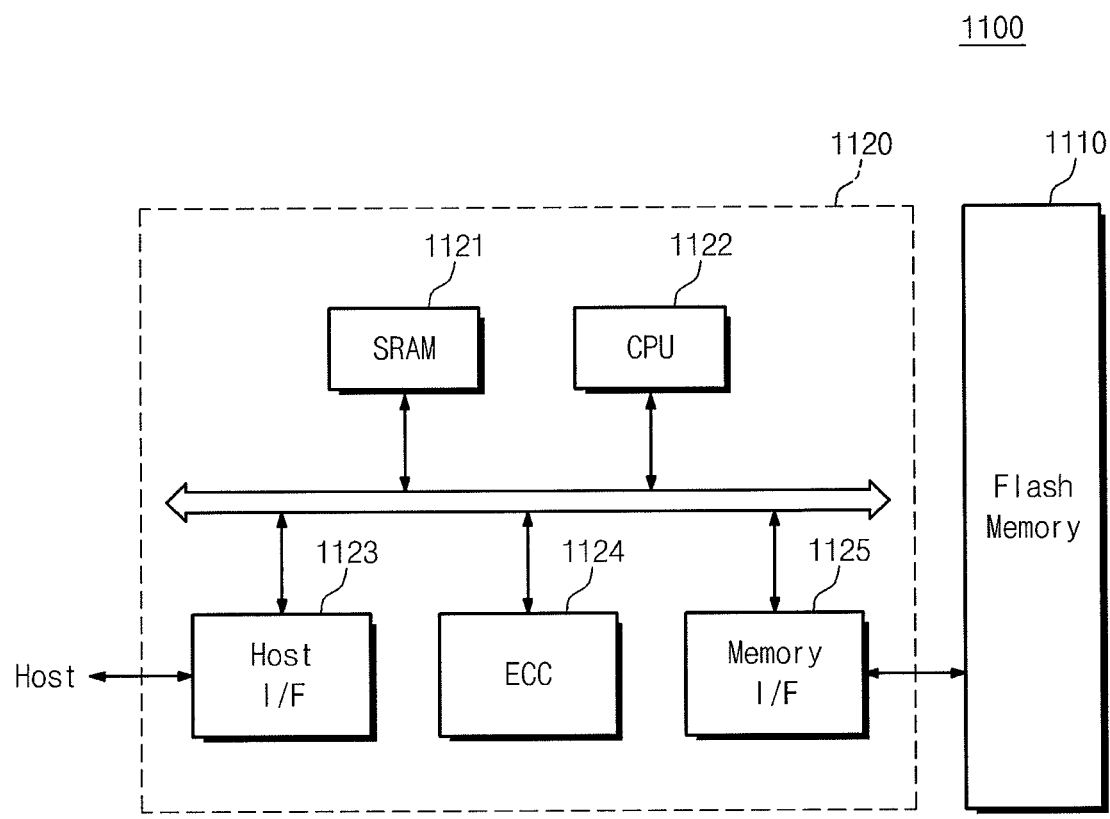
FIGS. 6 and 7 illustrate schematic views of applications of a semiconductor device according to embodiments.
Figure 7:
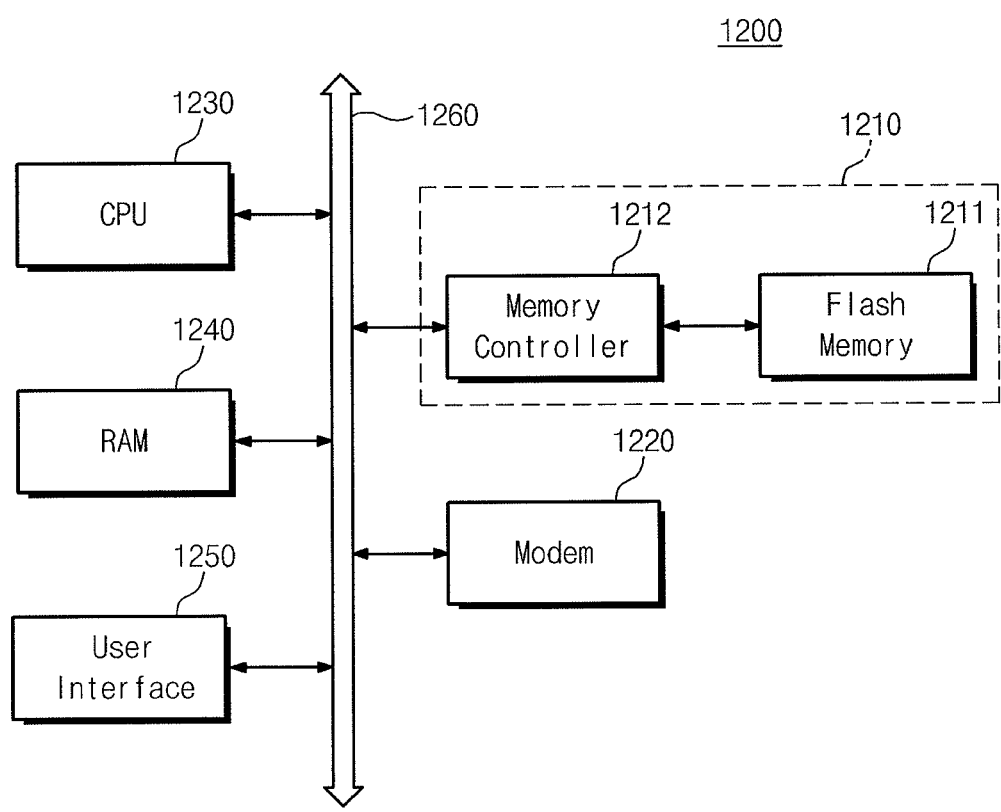

FIGS. 6 and 7 illustrate schematic views of applications of the semiconductor devices according to the embodiments. FIG. 6 illustrates a schematic block diagram of a memory system including the semiconductor device according to the embodiments.

Referring to FIG. 6, an electronic system 1100 may be used in, e.g., personal digital assistants (PDAs), portable computers, web tablets, wireless phones, mobile phones, digital music players, memory cards, and other equipment capable of data transferring and/or receiving in wireless environment.

The electric system 1100 may include a controller 1110, an input/output device 1120 such as a keypad, a keyboard and a display, a memory 1130, an interface 1140, and/or a bus 1150. The memory 1130 and the interface 1140 may communicate through the bus 1150.

The controller 1110 may include at least one of a micro processor, a digital signal processor, a micro controller and other process device. The memory 113 may store commands that are processed by the controller. Data and signals may be input or output through the input/output device.

The memory 1130 may include a semiconductor device according to an embodiment. The memory 1130 may include other sort of memory, a random accessible volatile memory, and other memory device.

The interface 1140 may transfer data to a network and/or may receive data from the network.

FIG. 7 illustrates a schematic block diagram of a memory card including a semiconductor device according to the embodiments.

Referring to FIG. 7, a high capacity memory card 1200 may include a flash memory device 1210 according to the embodiments. The memory card 1200 according to the embodiments may include a memory controller 1220 to control data exchanging between the flash memory device 1210 and a host.

SRAM (Static Random Access Memory; 1221) may be used as an operating memory for a processing unit 1222. A host interface 1223 may include a data exchanging protocol of the host connected with the memory card 1200. An error correcting block 1224 may detect and correct errors that may be included in data read from the flash memory device 1210. A memory interface 1225 may interface with the flash memory device 1210 according to the embodiments. The processing unit 1222 may perform various control operations for data exchanging of the memory controller 1220. Although not shown in drawings, it may be obvious to the skilled person in this field that ROM (Read Only Memory) may be provided to interface between the host and the memory card 1220 according to the embodiments.

According to the embodiments, a space between the first conductive lines may be filled with the first dielectric layer and a space between the second conductive lines may be filled with the second dielectric layer. The first dielectric layer may have a dielectric constant smaller than that of the second dielectric layer. Accordingly, parasitic capacitance may be reduced between the first conductive lines such that reliability of the semiconductor device may be improved.

According to the embodiments, high density integration of semiconductor devices may be achieved with little or no coupling between semiconductor devices, thereby maintaining performance of the semiconductor device.

The embodiments provide semiconductor devices having enhanced reliability and a method of fabricating the same.

The embodiments also provide semiconductor devices in which parasitic capacitance between word lines is reduced and a method of fabricating the same.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a substrate including a first region and a second region;
   first conductive lines on the first region, the first conductive lines being laterally spaced apart at a first interval;
   second conductive lines on the second region, the second conductive lines being laterally spaced apart at a second interval, the second interval being wider than the first interval;
   a first dielectric layer in spaces between the first conductive lines, a top surface of the first dielectric layer being lower than top surfaces of the first conductive lines;
   a second dielectric layer in spaces between the second conductive lines, the first dielectric layer having a dielectric constant different from a dielectric constant of the second dielectric layer;
   a barrier insulating pattern between the first dielectric layer and the first conductive lines, the barrier insulating pattern including a bottom portion parallel with the substrate and sidewall portions extending from side ends of the bottom portion; and
   a spacer within the spaces between the first conductive lines, the spacer having an etching selectivity with respect to the first dielectric layer, and the spacer covering an entire top surface of the first dielectric layer and top surfaces of the sidewall portions of the barrier insulating layer, the top surfaces of the sidewall portions being below the spacer.

2. The device as claimed in claim 1, wherein:
   the bottom portion of the barrier insulating pattern is between the first dielectric layer and the substrate, and
   the sidewall portions of the barrier insulating pattern is between the first dielectric layer and the first conductive line.

3. The device as claimed in claim 1, wherein the first conductive lines include:
   a tunnel insulating layer on the substrate;
   a charge storage layer on the tunnel insulating layer;
   a blocking layer on the charge storage layer; and
   a control gate electrode on the blocking layer,
   wherein:
      the top surface of the first dielectric layer is higher than a top surface of the charge storage layer, and
      the top surface of the first dielectric layer is lower than a top surface of the control gate electrode.

4. The device as claimed in claim 3, wherein the control gate electrode includes:
   a lower control gate electrode on the first blocking layer; and
   an upper control gate electrode on the lower control gate electrode,
   wherein an electric conductivity of the upper control gate electrode is higher than an electric conductivity of the lower control gate electrode.

5. The device as claimed in claim 1, wherein:
the first region is a memory cell region,
the second region is a selection region,
the substrate further includes a peripheral region separated from the first region as well as the second region,
the peripheral region includes peripheral gate patterns thereon, and
the second dielectric layer extends to the peripheral region to fill spaces between the peripheral gate patterns.

6. The device as claimed in claim 1, wherein the first dielectric layer has a dielectric constant smaller than a dielectric constant of silicon oxide.

7. The device as claimed in claim 6, wherein the first dielectric layer has a dielectric constant smaller than 3.

8. A semiconductor device, comprising:
a substrate including a first region and a second region;
first conductive lines on the first region, the first conductive lines being laterally spaced apart at a first interval;
second conductive lines on the second region, the second conductive lines being laterally spaced apart at a second interval, the second interval being wider than the first interval;
a first dielectric layer in spaces between the first conductive lines, a top surface of the first dielectric layer being lower than top surfaces of the first conductive lines;
a second dielectric layer in spaces between the second conductive lines, the first dielectric layer having a dielectric constant lower than a dielectric constant of the second dielectric layer;
a barrier insulating pattern between the first dielectric layer and the first conductive lines, the barrier insulating pattern including a bottom portion parallel with the substrate and sidewall portions extending from side ends of the bottom portion, and top surfaces of the sidewall portions are lower than top surfaces of the first conductive lines; and
a spacer covering an entirety of the top surface of the first dielectric layer and the top surfaces of the sidewall portions of the barrier insulating pattern, the spacer having an etching selectivity with respect to the first dielectric layer.

* * * * *